US011081203B2

(12) United States Patent
Majumdar et al.

(10) Patent No.: US 11,081,203 B2
(45) Date of Patent: Aug. 3, 2021

(54) LEAKAGE SOURCE DETECTION BY SCANNING ACCESS LINES

(71) Applicant: Micron Technology, Inc., Boise, ID (US)

(72) Inventors: Amitava Majumdar, Boise, ID (US); Radhakrishna Kotti, Boise, ID (US); Patrick Daniel White, Kuna, ID (US); Pavan Reddy K Aella, Eagle, ID (US); Rajesh Kamana, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/684,533

(22) Filed: Nov. 14, 2019

(65) Prior Publication Data

US 2021/0151119 A1    May 20, 2021

(51) Int. Cl.
| | |
|---|---|
| *G11C 29/38* | (2006.01) |
| *H01L 21/66* | (2006.01) |
| *G11C 29/44* | (2006.01) |
| *H04B 17/354* | (2015.01) |
| *H04B 1/525* | (2015.01) |
| *G11C 5/06* | (2006.01) |
| *G06F 3/06* | (2006.01) |

(52) U.S. Cl.
CPC ............ *G11C 29/38* (2013.01); *G06F 3/0619* (2013.01); *G11C 5/06* (2013.01); *G11C 29/44* (2013.01); *H01L 22/14* (2013.01); *H04B 1/525* (2013.01); *H04B 17/354* (2015.01)

(58) Field of Classification Search
CPC ......... G11C 29/38; G11C 29/44; H01L 22/14; H04B 17/354; H04B 1/525
See application file for complete search history.

(56) References Cited

U.S. PATENT DOCUMENTS

| | | | |
|---|---|---|---|
| 8,748,814 B1 * | 6/2014 | Xiao | H01J 37/28 250/306 |
| 2013/0024605 A1 * | 1/2013 | Sharon | G06F 11/1044 711/103 |
| 2014/0353573 A1 * | 12/2014 | Kalra | H01L 27/2481 257/5 |
| 2016/0343278 A1 * | 11/2016 | Tsujita | G09G 3/3233 |
| 2017/0249211 A1 * | 8/2017 | Hoei | G06F 3/0619 |
| 2019/0259737 A1 * | 8/2019 | Song | G11C 5/06 |

* cited by examiner

*Primary Examiner* — Sultana Begum
(74) *Attorney, Agent, or Firm* — Holland & Hart LLP

(57) ABSTRACT

Methods, systems, and devices for leakage source detection are described. In some cases, a testing device may scan a first set of access lines of a memory die that have a first length and a second set of access lines of the memory die that have a second length different than the first length. The testing device may determine a first error rate associated with the first set of access lines and a second error rate associated with the second set of access lines. The testing device may categorize a performance of the memory die based on the first and second error rates. In some cases, the testing device may determine a third error rate associated with a type of error based on the first and second error rates and may categorize the performance of the memory die based on the third error rate.

19 Claims, 9 Drawing Sheets

LEAKAGE SOURCE DETECTION BY SCANNING ACCESS LINES

BACKGROUND

The following relates generally to one or more systems that includes at least one memory device and more specifically to leakage source detection.

Memory devices are widely used to store information in various electronic devices such as computers, wireless communication devices, cameras, digital displays, and the like. Information is stored by programing memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read, or sense, at least one stored state in the memory device. To store information, a component may write, or program, the state in the memory device.

Various types of memory devices and memory cells exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), self-selecting memory, chalcogenide memory technologies, and others. Memory cells may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source.

DETAILED DESCRIPTION

Figure 1:
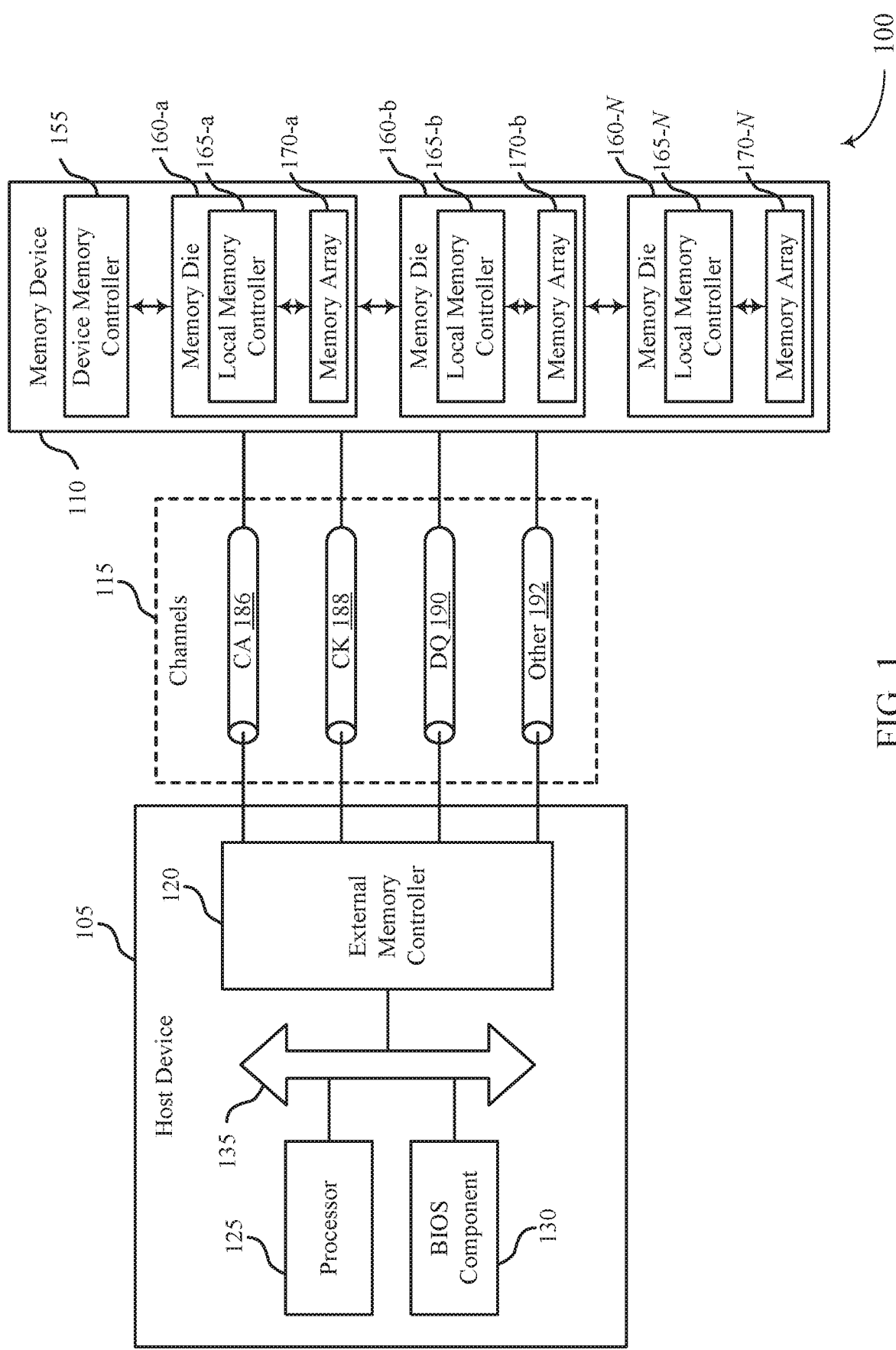
FIG. 1 illustrates an example of a system that supports leakage source detection in accordance with examples as disclosed herein.

A memory die may include one or more memory arrays subdivided into memory tiles. Each memory tile may include memory cells and access lines, where each memory cell is coupled with at least one of the access lines. Each access line may be coupled with a via that is selectively couplable with a substrate or a ground. Generally, the memory die may be capable of retrieving or storing data for a host device. In some cases, leakage may occur between a first access line and a second access line of a memory tile. In such cases, operations that involve activating the first access line or the second access line may errantly activate the second access line or the first access line, respectively. As such, operations directed towards memory cells on the first access line or the second access line may affect memory cells of the second access line or the first access line, respectively. As components in a memory device get smaller, the likelihood of leakage or unintentional shorts may increase. It may be desirable to have testing methods to identify current leakage to characterize a memory device or alter manufacturing processes to increase yield or both.

To identify a leakage a testing device may scan a set of test memory tiles with an electron beam, where the vias of a first set of access lines of the test memory tiles may be coupled to the ground and the vias of a second set of access lines of the test memory tiles may be isolated from the ground. After bombarding the access lines with an electron beam access lines that are isolated from the ground may "darker." If an access line that is supposed to be grounded "lights up", that may be evidence that there is a current leakage between the access line and an adjacent access line. The testing device may determine an error rate for the memory device based on scanning the tiles with the electron beam. The testing device may categorize the memory die based on the error rate. However, such methods may fail to differentiate between different sources of leakage. For instance, leakage may occur due to one access line shorting with another access line (i.e., line to line leakage), but may also occur due to one access line or via shorting with a via of another access line (i.e., line to via leakage). The method described above may lack a capability for determining whether the leakage source is due to line to line leakage or line to via leakage.

To improve the characterization of a memory device, it may be desirable to implement testing procedures that differentiate between leakage sources. For example, the testing procedures may identify at least two types of leakages (e.g., line to line leakage and line to via leakage) To enable a testing device to differentiate between leakage sources, the testing device may scan a first set of test memory tiles whose access lines have a first length and a second set of memory tiles whose access lines have a second, shorter length. Line to line leakage may occur less frequently between access lines that have the second, shorter length, but line to via leakage may occur approximately as often. After determining a first error rate for access lines of the first set of test memory tiles and a second error rate for access lines of the test memory tiles. By comparing the first error rate and the second error rate, the testing device may determine an error rate corresponding to line to line leakage and an error rate corresponding to line to via leakage. As such, the testing device may categorize the memory die based on the line to line leakage error rate, the line to via leakage error rate, or both.

By identifying a type of error or leakage in a memory device with greater granularity, more precise adjustments to a manufacturing process may be implemented. In addition, if the testing of the memory device occurs earlier in the manufacturing process, the adjustments to the manufacturing process may occur earlier and thereby reduce the quantity of memory devices that include an identified current leakage.

Features of the disclosure are initially described in the context of memory systems as described with reference to FIG. 1. Features of the disclosure are described in the context of a testing setup, access line configurations, a testing flow, and a manufacturing flow as described with reference to FIGS. 2-5. These and other features of the disclosure are further illustrated by and described with reference to flowcharts that relate to leakage source detection as described with references to FIGS. 6-9.

FIG. 1 illustrates an example of a system 100 that utilizes one or more memory devices in accordance with examples as disclosed herein. The system 100 may include a host device 105, a memory device 110, and a plurality of channels 115 coupling the host device 105 with the memory device 110. The system 100 may include one or more memory devices 110, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system operable to store data for one or more other components of the system 100.

At least portions of the system 100 may be examples of the host device 105. The host device 105 may be an example of a processor or other circuitry within a device that uses memory to execute processes, such as within a computing device, a mobile computing device, a wireless device, a graphics processing device, a computer, a laptop computer, a tablet computer, a smartphone, a cellular phone, a wearable device, an internet-connected device, or some other stationary or portable electronic device, among other examples. In some examples, the host device 105 may refer to the hardware, firmware, software, or a combination thereof that implements the functions of an external memory controller 120. In some examples, the external memory controller 120 may be referred to as a host or a host device 105.

A memory device 110 may be an independent device or a component that is operable to provide physical memory addresses/space that may be used or referenced by the system 100. In some examples, a memory device 110 may be configurable to work with one or more different types of host devices. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other factors.

The memory device 110 may be operable to store data for the components of the host device 105. In some examples, the memory device 110 may act as a slave-type device to the host device 105 (e.g., responding to and executing commands provided by the host device 105 through the external memory controller 120). Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of host device may be in coupled with one another using a bus 135.

The processor 125 may be operable to provide control or other functionality for at least portions of the system 100 or at least portions of the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or a combination of these components. In such examples, the processor 125 may be an example of a central processing unit (CPU), a graphics processing unit (GPU), a general purpose GPU (GPGPU), or a system on a chip (SoC), among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include a program or software stored in one or more of read-only memory (ROM), flash memory, or other non-volatile memory.

The memory device 110 may include a device memory controller 155 and one or more memory dies 160 (e.g., memory chips) to support a desired capacity or a specified capacity for data storage. Each memory die 160 may include a local memory controller 165 (e.g., local memory controller 165-$a$, local memory controller 165-$b$, local memory controller 165-N) and a memory array 170 (e.g., memory array 170-$a$, memory array 170-$b$, memory array 170-N). A memory array 170 may be a collection (e.g., one or more grids, one or more banks, one or more tiles, one or more sections) of memory cells, with each memory cell being operable to store at least one bit of data. A memory device 110 including two or more memory dies may be referred to as a multi-die memory or a multi-die package or a multi-chip memory or a multi-chip package.

In some cases, the memory arrays 170 of memory die 160 may be subdivided into multiple memory tiles. Each memory tile may contain a different subset of the memory cells contained in the memory arrays 170. Some of the memory tiles may be test memory tiles, which may be memory tiles that undergo testing by a tester to determine a quality of the memory die 160. In some cases, the test memory tiles may be located along one or more edges of the memory tile.

Each test memory tile may contain access lines (e.g., word lines or bit lines) coupled with at least some of the memory cells within that memory tile. In some cases, a first subset of the memory tiles may have an access line length that is approximately equal to those of other memory tiles that the tester does not use for testing and a second subset of the memory tiles may have a shorter access line length. The tester may determine a source of leakage between access lines by testing the first subset of memory tiles and the second subset of memory tiles.

The memory die 160 may be an example of a two-dimensional (2D) array of memory cells or may be an example of a three-dimensional (3D) array of memory cells. A 2D memory die 160 may include a single memory array 170. A 3D memory die 160 may include two or more memory arrays 170, which may be stacked on top of one another or positioned next to one another (e.g., relative to a substrate). In some examples, memory arrays 170 in a 3D memory die 160 may be referred to as decks, levels, layers, or dies. A 3D memory dies 160 may include any quantity of stacked memory arrays 170 (e.g., two high, three high, four high, five high, six high, seven high, eight high). In some 3D memory dies 160, different decks may share at least one common access line such that some decks may share one or more of a word line, a digit line, or a plate line.

The device memory controller 155 may include circuits, logic, or components operable to control operation of the memory device 110. The device memory controller 155 may include the hardware, the firmware, or the instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160.

A local memory controller 165 (e.g., local to a memory die 160) may be operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165, or the external memory controller 120 may perform various functions described herein. As such, a local memory controller 165 may be operable to communicate with the device memory controller 155, with other local memory controllers 165, or directly with the external memory controller 120, or the processor 125, or a combination thereof. Examples of components that may be included in the device memory controller 155 or the local memory controllers 165 or both may include receivers for receiving signals (e.g., from the external memory controller 120), transmitters for transmitting signals (e.g., to the extremal memory controller 120), decoders for decoding or demodulating received signals, encoders for encoding or modulating signals to be transmitted, or various other circuits or controllers operable for supporting described operations of the device memory controller 155 or local memory controller 165 or both.

The external memory controller 120 may be operable to enable communication of one or more of information, data, or commands between components of the system 100 or the host device 105 (e.g., the processor 125) and the memory device 110. The external memory controller 120 may convert or translate communications exchanged between the components of the host device 105 and the memory device 110. In some examples, the extremal memory controller 120 or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may be examples of transmission mediums that carry information between the host device 105 and the memory device. Each channel 115 may include one or more signal paths or transmission mediums (e.g., conductors) between terminals associated with the components of system 100. A signal path may be an example of a conductive path operable to carry a signal. For example, a channel 115 may include a first terminal including one or more pins or pads at the host device 105 and one or more pins or pads at the memory device 110. A pin may be an example of a conductive input or output point of a device of the system 100, and a pin may be operable to act as part of a channel.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or a combination thereof. In some examples, may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

Figure 2:
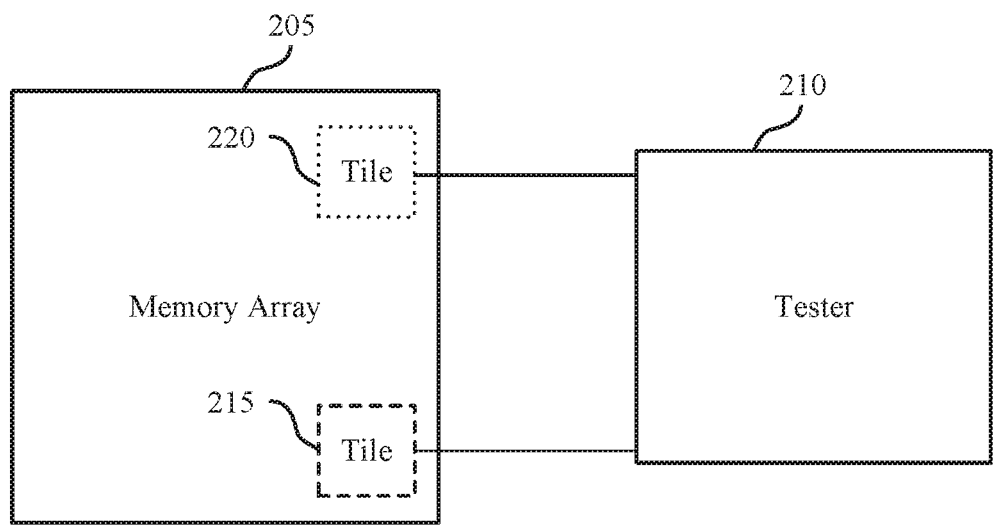
FIG. 2 illustrates an example of a testing setup that supports leakage source detection in accordance with examples as disclosed herein.

FIG. 2 illustrates an example of a testing setup 200 that supports leakage source detection in accordance with examples as disclosed herein. Testing setup 200 may involve a memory die 205 being coupled with a tester 210. The memory die 205 may be an example of a memory die 160 as described with reference to FIG. 1. In some cases, the methods as described herein may be performed if the memory die is a read with auto-precharge memory die in which interconnects are rerouted. Additionally or alternatively, the methods as described herein may be performed if the pitch (e.g., spacing between access lines) is below a threshold amount. In some examples, memory die 205 may be replaced by a more general logic circuit without deviating from the scope of present disclosure.

Memory die 205 may include one or more memory arrays, which may be subdivided into memory tiles, including test memory tiles 215 and 220. Each memory tile may contain a different subset of the memory cells contained in the one or more memory arrays. Additionally, each memory tile may include one or more access lines (e.g., word lines or bit lines), where each access line is coupled with at least one of the memory cells of the respective subset. Additionally, each access line of a memory tile may be coupled with a corresponding via.

Test memory tiles 215 and 220 may be memory tiles that tester 210 uses to perform tests on the memory die 205 and non-test memory tiles may be memory tiles that tester 210 does not use to perform tests on the memory die 205. Test memory tiles 215 may have a same length as compared to non-test memory tiles in the memory array (i.e., a full length) and test memory tiles 220 may have a shortened length compared to non-test memory tiles of the memory array (i.e., a shortened length). Details about how test memory tiles 215 and 220 are manufactured may be described with reference to FIG. 5.

In some cases, the vias coupled with each access line of memory tiles 215 and 220 may be coupled with a substrate upon which the memory die 205 rests. The substrate may include one or more circuits configured to activate or deactivate the access lines of the test memory tiles 215 and 220 via the via.

In some cases, leakage may occur between a first and a second access line of a memory tile, where leakage may involve at least some current or charge flowing in the first access line being transferred to the second access line or vice-versa. Leakage between access lines may be due to shorts between the first access line and the second access line (i.e., line to line leakage). Such shorts may be at least partially due to access lines approaching dimensions where failures or electrical shorts being to occur with a higher frequency (e.g., critical dimensions), the access lines having space with roughness, or a combination thereof. Additionally or alternatively, leakage between access lines may be due to the first access line shorting with a via of the second access line (i.e., line to via leakage), which may be caused by alignment issues, issues with the vias approaching dimensions where failures or electrical shorts being to occur with a higher frequency, or a combination thereof. Leakage occurring between access lines may be considered an error and line to line leakage and line to via leakage may be considered types of errors. In some cases, if a short between access lines occurs, those access lines may not be used to store data.

Inline or probe detection methods may quantify leakage between two or more components, but may fail to differentiate between whether leakage is due to shorting between access lines or shorting between an access line and a via. By using physical failure analysis and reticle shading, the leakage may be differentiated. However, such methods may not be quantitative or may have insufficient accuracy to be relied upon.

The tester 210 may be configured to test and categorize a performance of memory die 205. For instance, tester 210 may include an electron beam emitter configured to emit an electron beam onto test memory tiles 215 and 220. The tester 210 may use the electron beam to differentiate between leakage due to shorts between access lines and leakage due to shorts between an access line and a via. Based on how much leakage occurs due to shorts between access lines and how much occurs due to shorts between an access line and a via, the tester 210 may categorize the performance of the memory die 205. More details about how the tester 210 performs the testing procedure may be described with reference to FIG. 4.

Figure 3A:
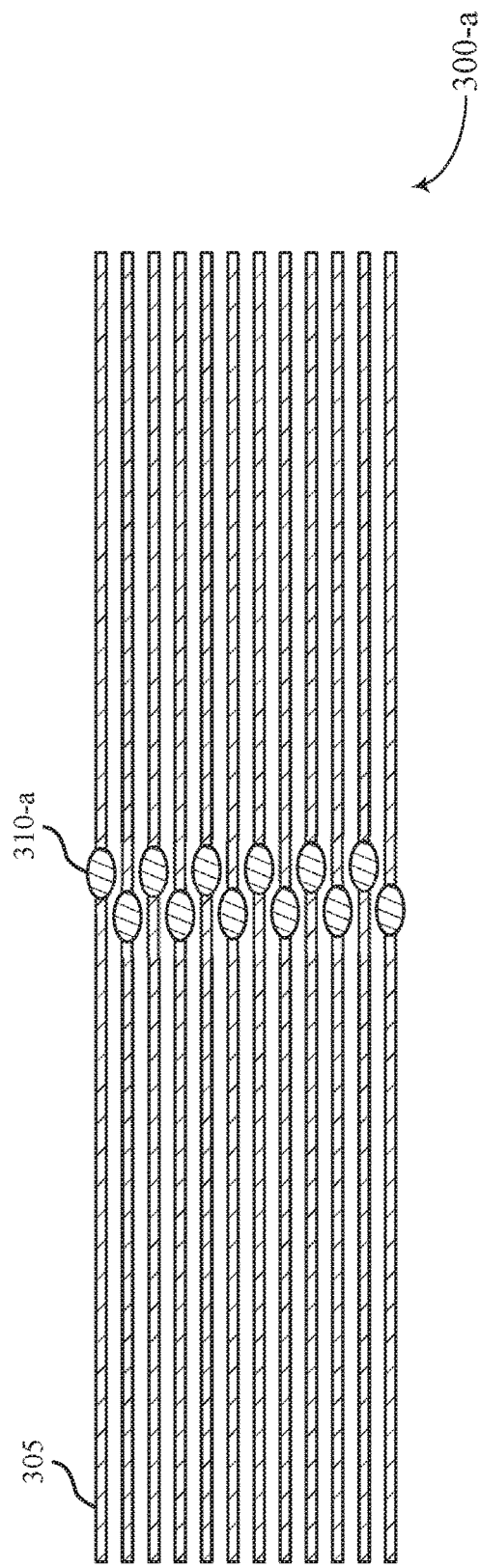
FIGS. 3A and 3B illustrate examples of access line configurations that support leakage source detection in accordance with examples as disclosed herein.
Figure 3B:
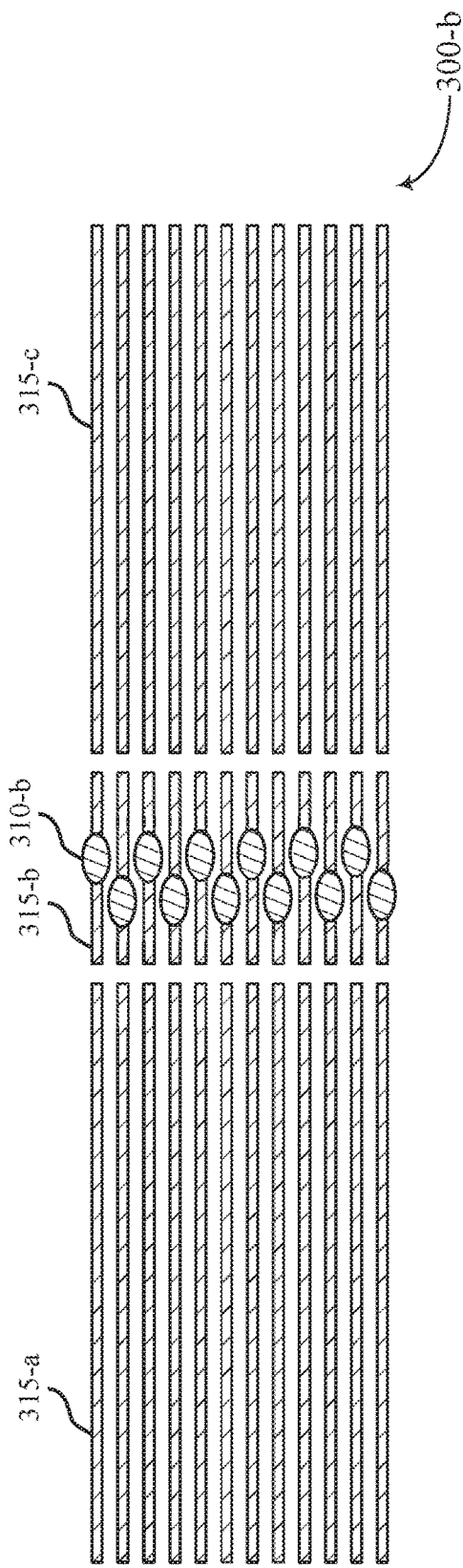

FIGS. 3A and 3B illustrate examples of access line configurations 300-*a* and 300-*b* that support leakage source detection in accordance with examples as disclosed herein. Although the present example is described with reference to memory tiles 220, the configurations or methods described herein may apply to various types of semiconductor technologies (e.g., logic circuits) in which lines and contacts (e.g., vias) are used and are not limited to memory devices.

Access line configuration 300-*a* may represent access lines of a full-length memory tile 215 as described with reference to FIG. 2. Access line configuration 300-*a* may include access lines 305, where each access line is coupled with a respective via 310-*a*. Each access line 305 may have an approximately uniform length L to each other, which may be enabled by a processing step that chops the edges of access line 305. A via may be an example of a contact and the methods described herein may also be applied to any type of electrical contact, including but not limited to a via.

Access line configuration 300-*b*, meanwhile, may represent access lines of a shortened memory tile 220 as described with reference to FIG. 2. Access line configuration 300-*b* may include access line portions 315-*a*, 315-*b*, and 315-*c*. Access line portions 315-*a*, 315-*b*, and 315-*b* may represent an access line 305 after undergoing a modified version of the processing step that chops the edges of the access line 305. The modified version of the processing step may still involve chopping the edges of the access line 305, but may also involve chopping within the access line at two points to form access line portions 315-*a*, 315-*b* and 315-*c*. In some cases, chopping the edges of the access lines 305 and chopping the access line at two points may be done as part of a same processing step. For instance, the processing step may include additional parameters that enables chopping at the edges and at the two points as part of the same processing step. In one example, chopping the edges of the access lines 305 and chopping access lines 305 at two points may be done simultaneously by a chop reticle. In another example, chopping access lines 305 at two points may be done prior to or after chopping the edges of the access lines 305, but prior to the access lines undergoing a different processing step (e.g., a deposition step). Each access line portion 315-*b* may be coupled with a respective via 310-*b* and may have a shortened length l as compared to access line 305.

A tester (e.g., a tester 210 as described in FIG. 2) may perform a technique that may be referred to as voltage contrasting. For instance, the tester may emit an electron beam onto memory tiles with access line configuration 300-*a* and memory tiles with access line configuration 300-*b*. To enable testing for shorts in the former memory tiles, the memory die containing the memory tiles may operate such that vias 310-*a* of a first set of access lines 305 are isolated from ground and vias 310-*a* of a second set of access lines 305 are coupled to ground. Similarly, to enable testing for shorts in the latter memory tiles, the memory die containing the memory tiles may operate such that vias 310-*b* of a first set of access line portions 315-*b* are isolated from ground and vias 310-*b* of a second set of access line portions 315-*b* are coupled to ground. The first and second sets of the access lines 305 or access line portions 315-*b* may be configured in an alternating pattern. For instance, a via 310-*a* of a first access line 305 or a via 310-*b* of a first access line portion 315-*b* may be isolated from ground, a via 310-*a* of a second access line 305 or a via 310-*b* of an access line portion 315-*b* adjacent to the first may be coupled to ground, a via 310-*a* of a third access line 305 or a via 310-*b* of access line portion 315-*b* adjacent to the second may be isolated from ground, and so on.

Generally, upon applying the electron beam, the access lines 305 and access line portions 315-*b* whose vias are coupled to ground may reflect more electrons back to a detector of the testing device as compared to access lines 305 and access line portions 315-*b* whose vias are isolated from ground. If an access line 305 or access line portion 315-*b* of the second set has a brightness above a threshold amount that corresponds to an increased quantity of reflected electrons, the tester may determine that the access line 305 or access line portion 315-*b* is leaking onto at least one of the adjacent access lines 305 or access line portions 315-*b*. As described in further detail with reference to FIG. 4, the tester may use the quantity of access lines 305 in the second set that have a brightness above the threshold amount and the quantity of access line portions 315-*b* in the second set that have a brightness above the threshold amount to differentiate between line to line leakage and line to via leakage, which may also be referred to as performing root cause detection.

Figure 4:
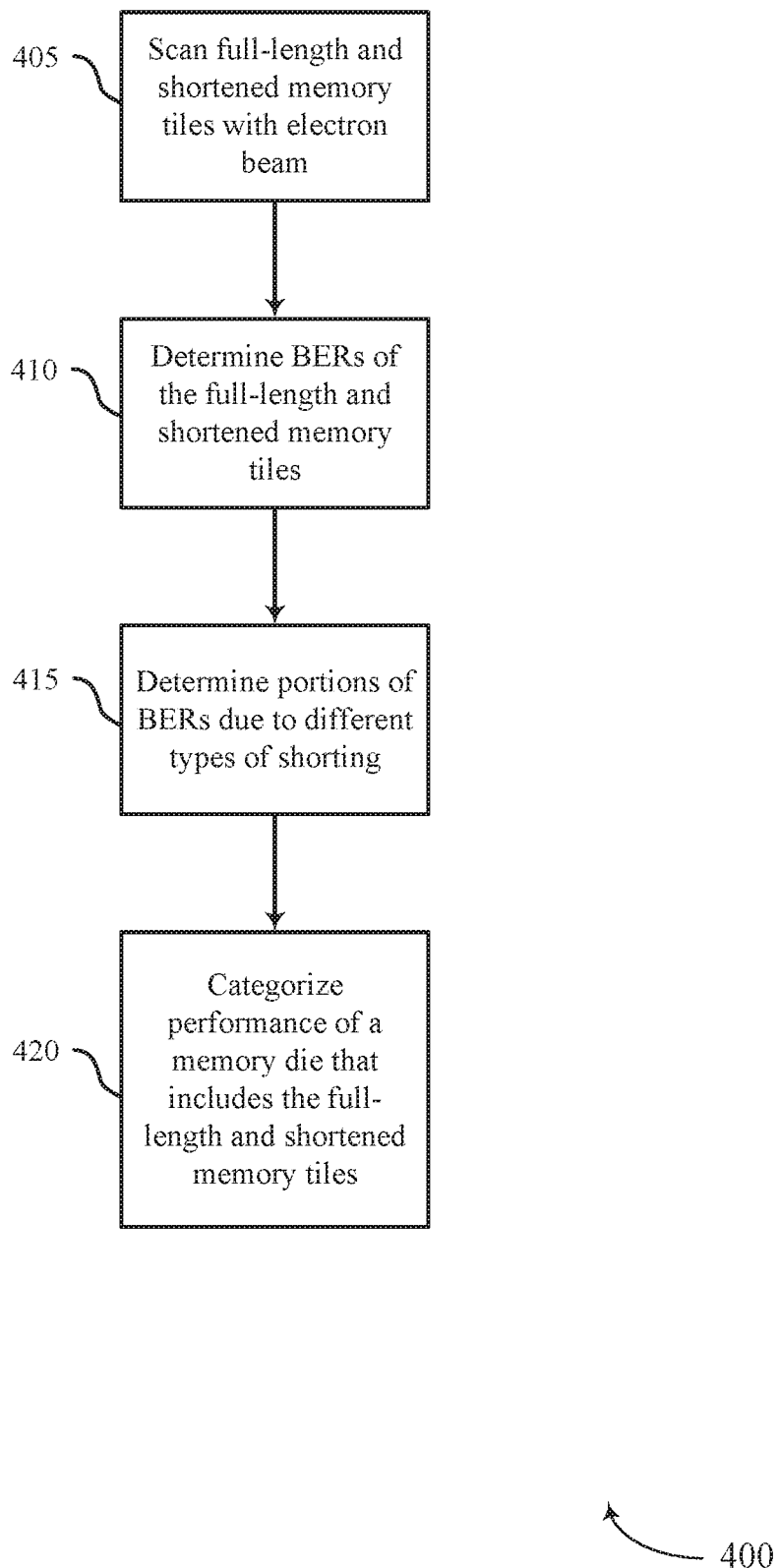
FIG. 4 illustrates an example of a testing flow that supports leakage source detection in accordance with examples as disclosed herein.

FIG. 4 illustrates an example of a testing flow 400 that supports leakage source detection in accordance with examples as disclosed herein. Testing flow 400 may represent a method implemented by a tester 210, as described with reference to FIG. 2, to test memory tiles 215 and 220. It should be noted that the testing as described herein may additionally or alternatively be applied to interconnect layers and/or pitch multiplication layers Additionally or alternatively, a tester may use the methods described herein to more generally differentiate between leakage between lines and leakage between a line and a contact.

At 405, a tester may scan full-length memory tiles (e.g., test memory tiles 215) and shortened memory tiles (e.g., test memory tiles 220) with an electron beam. As described in FIG. 3, access lines of the full-length memory tiles and access line portions of the shortened memory tiles whose vias are isolated from ground may errantly light up if they leak onto adjacent access lines or access line portions, respectively. Access lines whose vias are isolated from ground may be referred to as isolated access lines and isolated access lines that errantly light up may be referred to as leaking access lines. Similarly, access line portions whose vias are isolated from ground may be referred to as isolated access line portions and isolated access line portions that errantly light up may be referred to as leaking access line portions.

At 410, the tester may determine a first bit error rate (BER) $BER_{Full\_Tile}$, for the full-length memory tiles and a second BER $BER_{Short\_Tile}$ for the shortened memory tiles. $BER_{Full\_Tile}$ may be determined s a ratio of a quantity of leaking access lines of the full-length memory tiles to the total quantity of isolated access line portions of the full-length memory tiles. Similarly, $BER_{Short\_Tile}$ may be determined as a ratio of a quantity of leaking access line portions to the total quantity of isolated access line portions of the shortened memory tiles.

At 415, the tester may determine an additional BER $BER_{Line-Line}$ that represents a ratio of a quantity of access lines of the full-length memory tiles leaking due to line-to-line leakage to the total quantity of isolated access lines of the full-length memory tiles. Additionally or alternatively, the tester may determine another BER $BER_{Line-Via}$ that represents a ratio of a quantity of access lines of the full-length memory tiles leaking due to line-to-via leakage to the total quantity of isolated access lines of the full-length memory tiles. $BER_{Full\_Tile}$ may be approximately equal to $BER_{Line-Line}+BER_{Line-Via}$ and $BER_{Short\_Tile}$ may be approximately equal to $(BER_{Line-Line}/X)+BER_{Line-Via}$, where X may equal to the ratio L/l. The tester may identify X or may identify l and L and determine X accordingly. Rearranging the relationships above, $BER_{Line-Line}$ may be shown by Equation 1.

$$BER_{Line-Line} = \frac{X(BER_{Full\_Tile} - BER_{Short\_Tile})}{X - 1} \quad (1)$$

The $BER_{Line-Via}$ may be shown by Equation 2.

$$BER_{Line-Via} = \frac{X * BER_{Short\_Tile} - BER_{Full\_Tile}}{X - 1} \quad (2)$$

As l may be shorter than L, the probability of a short between an access line portion and another access line portion may be smaller than that of a short between an access line and another access line. As such, the contribution of $BER_{Line-Line}$ may be smaller for $BER_{Short\_Tile}$, which may be modeled by $(BER_{Line-Line}/X)$, as compared to $BER_{Full\_Tile}$. However, as the quantity of vias per access line of the full-length memory tiles may be the same as the quantity of vias per access line portion of the shortened memory tiles, the contribution of $BER_{Line-Via}$ to $BER_{Short\_Tile}$ may be approximately the same as compared to $BER_{Full\_Tile}$.

At 420, the tester may categorize a performance of the memory die into one of a set of classes based on $BER_{Line-Line}$ and/or $BER_{Line-Via}$. For instance, if $BER_{Line-Line}$, $BER_{Line-Via}$, or both exceed respective thresholds, the memory die may be categorized into a worse performing class and if $BER_{Line-Line}$, $BER_{Line-Via}$, or both are below respective thresholds, the memory die may be categorized into a better performing class. In some cases, the tester may output an indication of $BER_{Line-Line}$, $BER_{Line-Via}$, the performance of the memory die (e.g., the class to which the memory die belongs), or a combination thereof.

Performing the methods as described with reference to FIG. 4 may enable a tester to quantity sources of leakage and their effect on a memory die with a greater degree of accuracy than other methods. Quantifying the sources of leakage and their effect may enable memory dies to be categorized based on their sources of leakage and may enable more precise adjustments to be made to a manufacturing process for manufacturing the memory die. For instance, if a tester determines that a memory die has $BER_{Lin-Line}$ above a threshold, a manufacturing system may adjust manufacturing steps in a first way, and if the tester determines that the memory die has $BER_{Line-Via}$ above a threshold, the manufacturing system may adjust manufacturing steps in a second way. The first way that manufacturing steps may be adjusted may be different than the second way that manufacturing steps may be adjusted.

Figure 5:
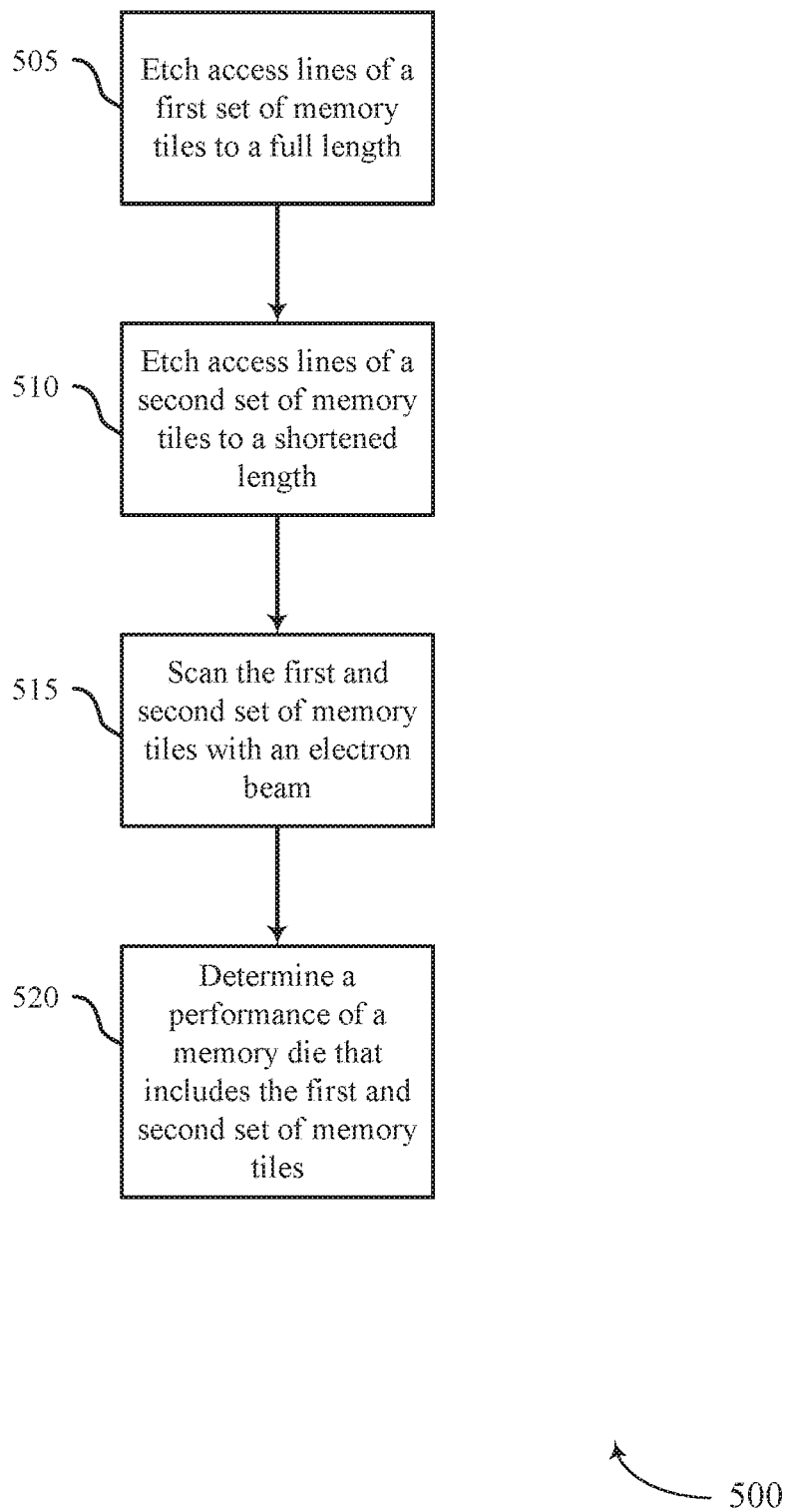
FIG. 5 illustrates an example of a manufacturing flow that supports leakage source detection in accordance with examples as disclosed herein.

FIG. 5 illustrates an example of a manufacturing flow 500 that supports leakage source detection in accordance with examples as disclosed herein. Manufacturing flow 500 may represent a method implemented by a manufacturing system that forms test memory tiles 215 and 220 as described with reference to FIG. 2.

At 505, a manufacturing system may etch access lines of a first set of test memory tiles (e.g., test memory tiles 215) of a memory die to a full-length using, for example, a chop reticle.

At 510, the manufacturing system may etch access lines of a second set of test memory tiles (e.g., test memory tiles 220) to a full length using, for example, the chop reticle. The manufacturing system may additionally etch the access lines of the second set of test memory tiles to shortened length. The manufacturing system may do so by chopping at a first and a second point along each of the access lines of the second set of test memory tiles when the access lines are at a full length. As such, the etching may isolate a first portion of an access line (e.g., a portion starting at an outer edge of the first point) and a second portion of and a second portion of an access line (e.g., a portion starting at an outer edge of the second point) from vias. A remaining portion (e.g., a portion between the first and second points) may be coupled with the via and may have the shortened length.

In some cases, etching the second set of test memory tiles to the shortened length may occur during at least a portion of a same processing step as etching each of a total set of memory tiles to the full-length that includes additional parameters for performing the additional cuts. In one example, etching the second set of test memory tiles to the shortened length and etching each of the total set of memory tiles to the full-length may be done simultaneously by a chop reticle. In another example, etching the second set of test memory tiles to the shortened length may be done prior to or after etching each of the total set of memory tiles to the full length, but prior to the memory tiles undergoing a different processing step (e.g., a deposition step).

At 515, the manufacturing system may scan the first and second set of memory tiles with an electron beam, such as described with reference to FIGS. 3 and 4. For instance, the manufacturing system may include a tester 210 as described with reference to FIG. 2 that is integrated with the manufacturing system. At 520, the manufacturing system may determine a performance of the memory die, such as described with reference to FIG. 4. In some cases. 515 and/or 520 may occur during manufacturing processes of the memory die.

Manufacturing memory dies as described herein may yield several advantages. For instance, assuming that testing occurs during the manufacturing process and that a cause of an error (e.g., a source of leakage) is identified, the manufacturing system may perform steps to correct the error. Additionally or alternatively, the methods described herein may enable testing to be done earlier in a manufacturing process as compared to other testing processes. For instance, testing with an electron beam, as described herein, may be done on the manufacturing line. As such, the methods described herein may enable manufacturing parameters to be adjusted to reduce a quantity of memory devices that have leakages and that are manufactured after the testing process is completed. For instance, the manufacturing system may adjust parameters associated with forming access lines or vias (e.g., chemicals used in forming access lines or vias, a duration for which chemicals are applied, a spacing of the access lines or vias).

Figure 6:
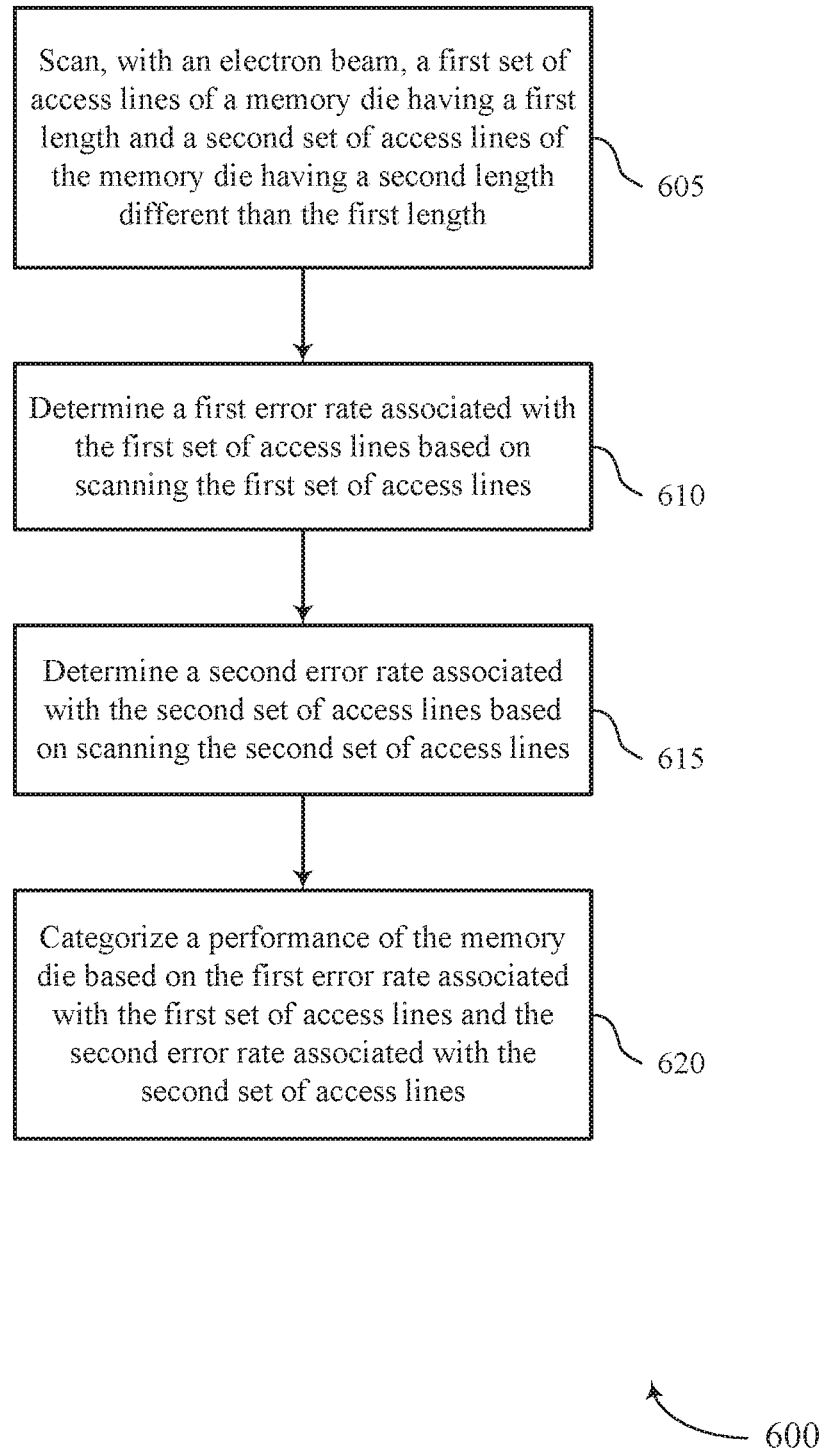
FIGS. 6 through 9 show flowcharts illustrating a method or methods that support leakage source detection in accordance with examples as disclosed herein.

FIG. 6 shows a flowchart illustrating a method or methods 600 that supports leakage source detection in accordance with examples as disclosed herein. The operations of method 600 may be implemented by a tester or its components as described herein. For example, the operations of method 600 may be performed by a tester 210 as described with reference to FIG. 2. In some examples, a tester may execute a set of instructions to control the functional elements of the tester to perform the described functions. Additionally or alternatively, a tester may perform aspects of the described functions using special-purpose hardware.

At 605, the tester may scan, with an electron beam, a first set of access lines of a memory die having a first length and a second set of access lines of the memory die having a second length different than the first length. The operations of 605 may be performed according to the methods described herein.

At 610, the tester may determine a first error rate associated with the first set of access lines based on scanning the first set of access lines. The operations of 610 may be performed according to the methods described herein.

At 615, the tester may determine a second error rate associated with the second set of access lines based on scanning the second set of access lines. The operations of 615 may be performed according to the methods described herein.

At 620, the tester may categorize a performance of the memory die based on the first error rate associated with the first set of access lines and the second error rate associated with the second set of access lines. The operations of 620 may be performed according to the methods described herein.

In some examples, an apparatus as described herein may perform a method or methods, such as the method 600. The apparatus may include features, means, or instructions (e.g., a non-transitory computer-readable medium storing instructions executable by a processor) for scanning, with an electron beam, a first set of access lines of a memory die having a first length and a second set of access lines of the memory die having a second length different than the first length, determining a first error rate associated with the first set of access lines based on scanning the first set of access lines, determining a second error rate associated with the second set of access lines based on scanning the second set of access lines, and categorizing a performance of the memory die based on the first error rate associated with the first set of access lines and the second error rate associated with the second set of access lines.

Some examples of the method 600 and the apparatus described herein may further include operations, features, means, or instructions for determining a third error rate associated with a first type of error based on the first error rate of the first set of access lines and the second error rate of the second set of access lines, and determining a fourth error rate associated with a second type of error different than the first type of error based on the first error rate of the first set of access lines and the second error rate of the second set of access lines, where categorizing the performance may be based on determining the third error rate and the fourth error rate. In some examples of the method 600 and the apparatus described herein, the first type of error includes one or more errors that occur because of shorting between access lines of the memory die, and the second type of error includes one or more additional errors that occur because of shorting between access lines and vias of the memory die.

In some examples of the method 600 and the apparatus described herein, determining the third error rate or determining the fourth error rate may include operations, features, means, or instructions for determining a difference between the first error rate and the second error rate. Some examples of the method 600 and the apparatus described herein may further include operations, features, means, or instructions for identifying a ratio of the first length of the first set of access lines and the second length of the second set of access lines, where determining the third error rate or determining the fourth error rate may be based on the ratio of the first length and the second length.

Some examples of the method 600 and the apparatus described herein may further include operations, features, means, or instructions for determining whether the third error rate or the fourth error rate satisfies a threshold, where categorizing the performance of the memory die may be based on determining whether the third error rate or the fourth error rate satisfies the threshold. Some examples of the method 600 and the apparatus described herein may further include operations, features, means, or instructions for outputting an indication of the third error rate, the fourth error rate, the performance of the memory die, or a combination thereof.

In some examples of the method 600 and the apparatus described herein, scanning the first set of access lines may include operations, features, means, or instructions for coupling a first subset of access lines of the first set with a substrate, isolating a second subset of access lines of the first set from the substrate, the second subset different than the first subset, and applying the electron beam to the first set of access lines based on coupling the first subset with the substrate and isolating the second subset from the substrate. Some examples of the method 600 and the apparatus described herein may further include operations, features, means, or instructions for identifying a first quantity of access lines based on the applying the electron beam, where determining the first error rate may be based on identifying the first quantity of access lines.

In some examples of the method 600 and the apparatus described herein, a first memory tile of the memory die includes the first set of access lines, and a second memory tile of the memory die different than the first memory tile includes the second set of access lines. In some examples of the method 600 and the apparatus described herein, a type of error of the memory die includes an access line to access line short, an access line to via short, or a combination thereof.

Figure 7:
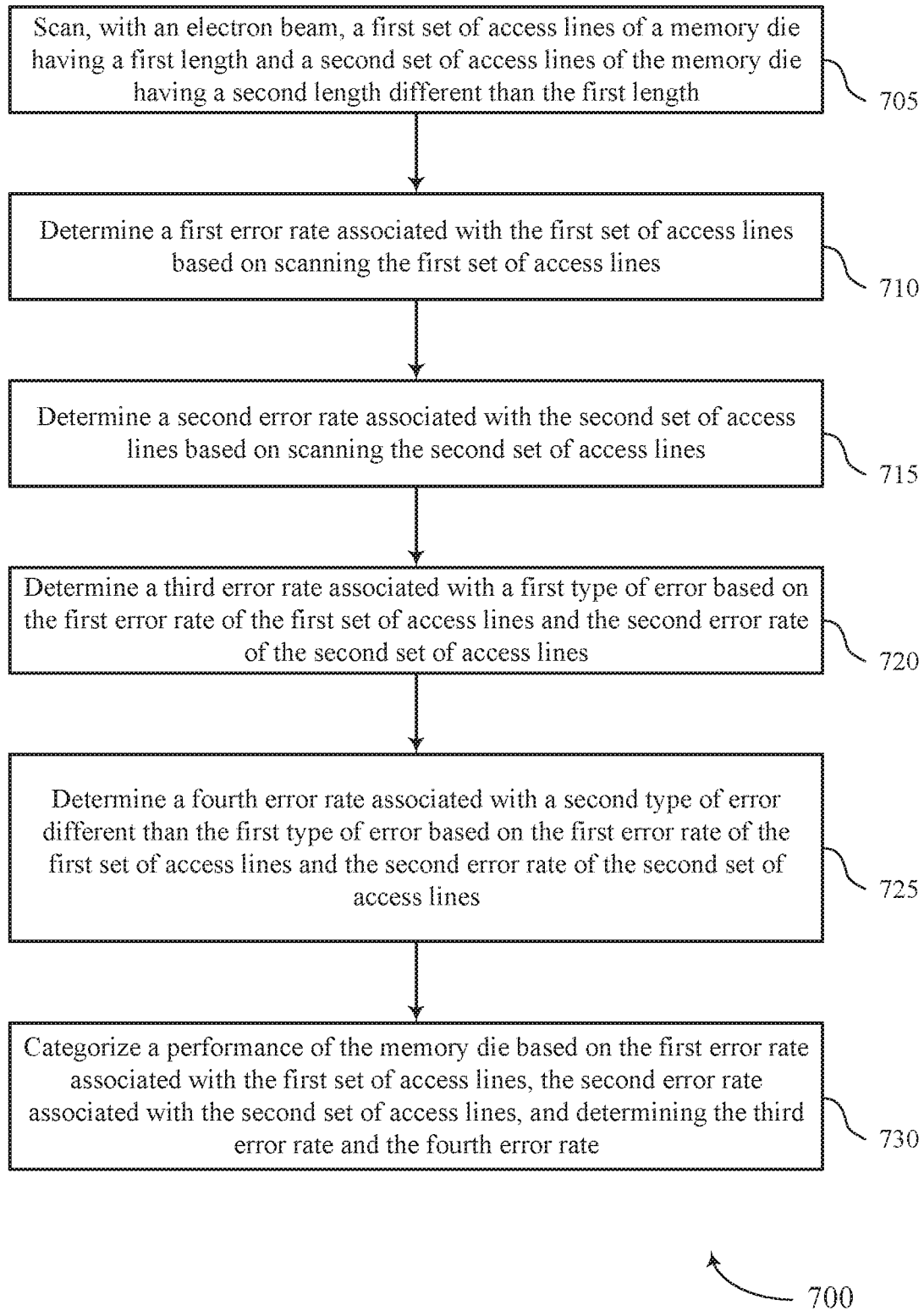

FIG. 7 shows a flowchart illustrating a method or methods 700 that supports leakage source detection in accordance with examples as disclosed herein. The operations of method 700 may be implemented by a tester or its components as described herein. For example, the operations of method 700 may be performed by a tester 210 as described with reference to FIG. 2. In some examples, a tester may execute a set of instructions to control the functional elements of the tester to perform the described functions. Additionally or alternatively, a tester may perform aspects of the described functions using special-purpose hardware.

At 705, the tester may scan, with an electron beam, a first set of access lines of a memory die having a first length and a second set of access lines of the memory die having a second length different than the first length. The operations of 705 may be performed according to the methods described herein.

At 710, the tester may determine a first error rate associated with the first set of access lines based on scanning the first set of access lines. The operations of 710 may be performed according to the methods described herein.

At 715, the tester may determine a second error rate associated with the second set of access lines based on scanning the second set of access lines. The operations of 715 may be performed according to the methods described herein.

At 720, the tester may determine a third error rate associated with a first type of error based on the first error rate of the first set of access lines and the second error rate of the second set of access lines. The operations of 720 may be performed according to the methods described herein.

At 725, the tester may determine a fourth error rate associated with a second type of error different than the first type of error based on the first error rate of the first set of access lines and the second error rate of the second set of access lines. The operations of 725 may be performed according to the methods described herein.

At 730, the tester may categorize a performance of the memory die based on the first error rate associated with the first set of access lines, the second error rate associated with the second set of access lines, and determining the third error rate and the fourth error rate. The operations of 730 may be performed according to the methods described herein.

Figure 8:
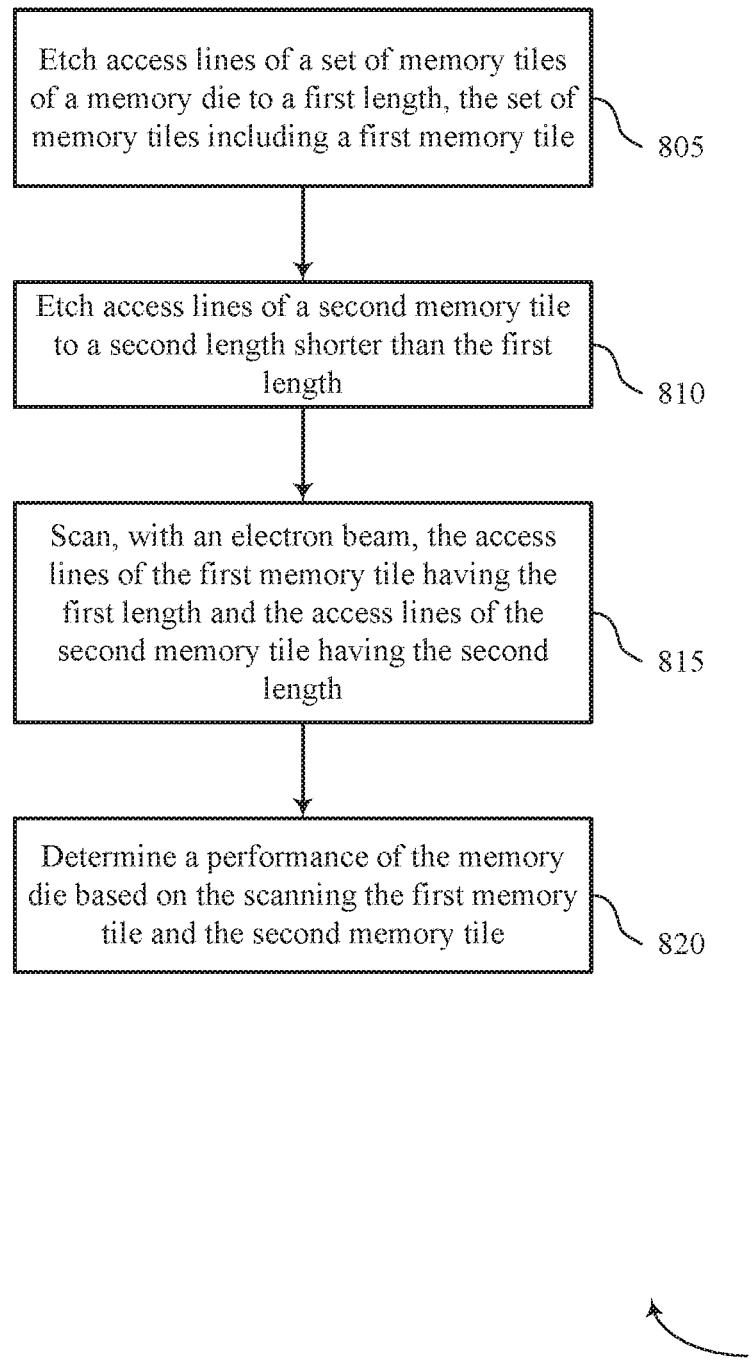

FIG. 8 shows a flowchart illustrating a method or methods 800 that supports leakage source detection in accordance with examples as disclosed herein. The operations of method 800 may be implemented by a manufacturing system or one or more controllers associated with a manufacturing system. In some examples, one or more controllers may execute a set of instructions to control one or more functional elements of the manufacturing system to perform the described functions. Additionally or alternatively, one or more controllers may perform aspects of the described functions using special-purpose hardware.

At 805, the method 800 may include etching access lines of a set of memory tiles of a memory die to a first length, the set of memory tiles including a first memory tile. The operations of 805 may be performed according to the methods described herein.

At 810, the method 800 may include etching access lines of a second memory tile to a second length shorter than the first length. The operations of 810 may be performed according to the methods described herein.

At 815, the method 800 may include scanning, with an electron beam, the access lines of the first memory tile having the first length and the access lines of the second memory tile having the second length. The operations of 815 may be performed according to the methods described herein.

At 820, the method 800 may include determining a performance of the memory die based on the scanning the first memory tile and the second memory tile. The operations of 820 may be performed according to the methods described herein.

In some examples, an apparatus as described herein may perform a method or methods, such as the method 800. The apparatus may include features, means, or instructions (e.g., a non-transitory computer-readable medium storing instructions executable by a processor) for etching access lines of a set of memory tiles of a memory die to a first length, the set of memory tiles including a first memory tile, etching access lines of a second memory tile to a second length shorter than the first length, scanning, with an electron beam, the access lines of the first memory tile having the first length and the access lines of the second memory tile having the second length, and determining a performance of the memory die based on the scanning the first memory tile and the second memory tile.

In some examples of the method 800 and the apparatus described herein, etching the access lines of the second memory tile may include operations, features, means, or instructions for isolating one or more portions of each of the access lines from vias of the second memory tile, where a remaining portion of the access lines having the second length may be coupled with the vias. Some examples of the method 800 and the apparatus described herein may further include operations, features, means, or instructions for identifying the second length for access lines, where etching the second memory tile may be based on identifying the second length. In some examples of the method 800 and the apparatus described herein, the access lines of the set of memory tiles and the access lines of the second memory tile include word lines.

Some examples of the method 800 and the apparatus described herein may further include operations, features, means, or instructions for etching the access lines of the second memory tile to the second length occurs during at least a portion of a same processing step as etching the access lines of the set of memory tiles to the first length. Some examples of the method 800 and the apparatus described herein may further include operations, features, means, or instructions for scanning the access lines of the first memory tile and the access lines of the second memory tile occurs during manufacturing processes of the memory die.

Figure 9:
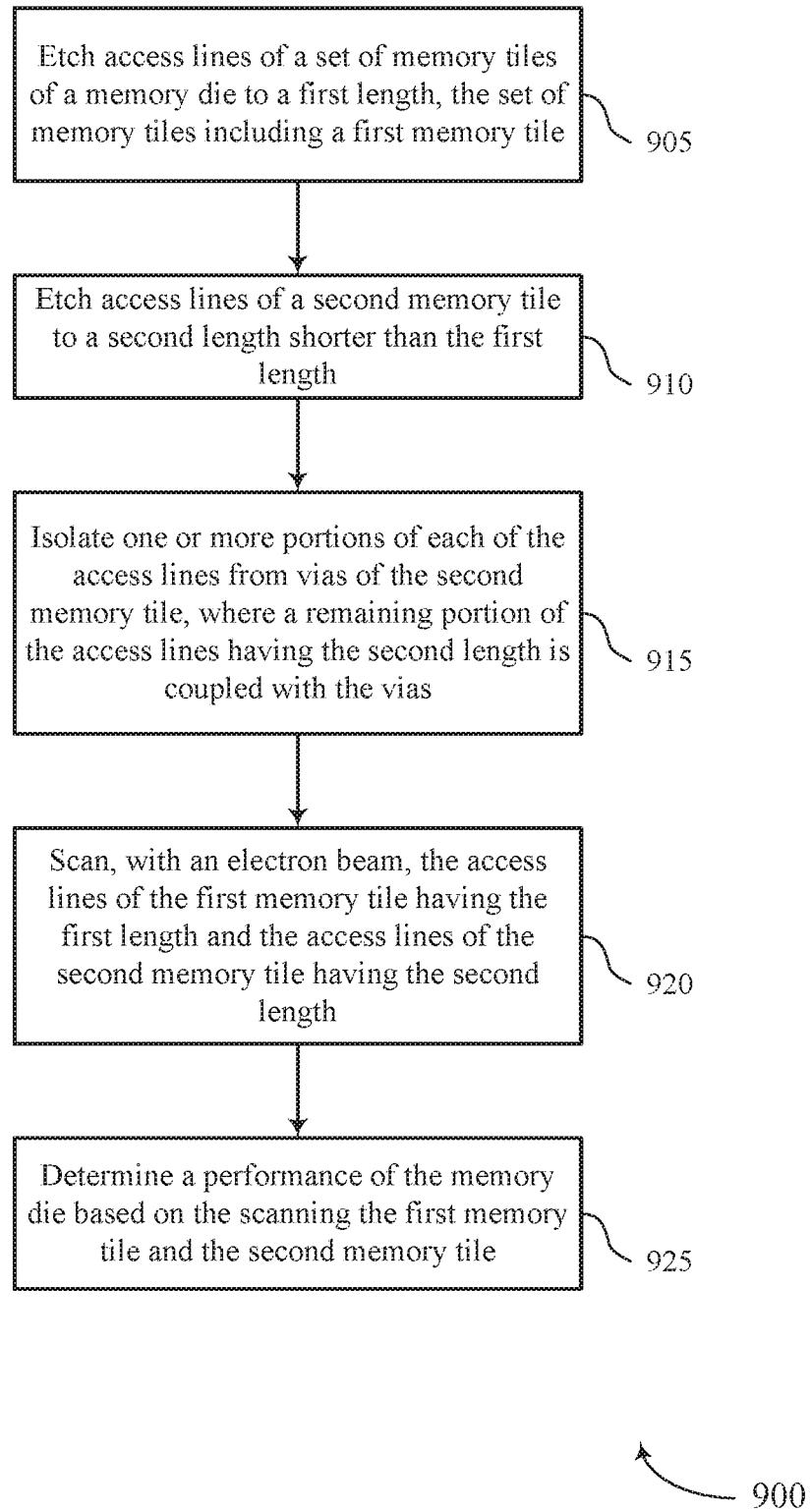

FIG. 9 shows a flowchart illustrating a method or methods 900 that supports leakage source detection in accordance with examples as disclosed herein. The operations of method 900 may be implemented by a manufacturing system or one or more controllers associated with a manufacturing system. In some examples, one or more controllers may execute a set of instructions to control one or more functional elements of the manufacturing system to perform the described functions. Additionally or alternatively, one or more controllers may perform aspects of the described functions using special-purpose hardware.

At 905, the method 900 may include etching access lines of a set of memory tiles of a memory die to a first length, the set of memory tiles including a first memory tile. The operations of 905 may be performed according to the methods described herein.

At 910, the method 900 may include etching access lines of a second memory tile to a second length shorter than the first length. The operations of 910 may be performed according to the methods described herein.

At 915, the method 900 may include isolating one or more portions of each of the access lines from vias of the second memory tile, where a remaining portion of the access lines having the second length is coupled with the vias. The operations of 915 may be performed according to the methods described herein.

At 920, the method 900 may include scanning, with an electron beam, the access lines of the first memory tile having the first length and the access lines of the second memory tile having the second length. The operations of 920 may be performed according to the methods described herein.

At 925, the method 900 may include determining a performance of the memory die based on the scanning the first memory tile and the second memory tile. The operations of 925 may be performed according to the methods described herein.

It should be noted that the methods described above describe possible implementations, and that the operations and the steps may be rearranged or otherwise modified and that other implementations are possible. Further, portions from two or more of the methods may be combined.

An apparatus is described. The apparatus may include a first portion of a memory die including a first set of access lines having a first length and a second portion of the memory die including a second set of access lines having a second length different than the first length, where the second portion of the memory die is operable to determine a first error rate associated with a first type of error and a second error rate associated with a second type of error different than the first type of error.

In some examples, the second length may be shorter than the first length. In some examples, the first set of access lines and the second set of access lines may be selectively couplable with a substrate using one or more vias. In some examples, the first set of access lines and the second set of access lines may be word lines, bit lines, or metal interconnects. In some examples, the first type of error includes one or more errors that occur because of shorting between adjacent access lines of the memory die, and the second type of error includes one or more additional errors that occur because of shorting between access lines and adjacent vias of the memory die.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The term "layer" or "level" used herein refers to a stratum or sheet of a geometrical structure (e.g., relative to a substrate). Each layer or level may have three dimensions (e.g., height, width, and depth) and may cover at least a portion of a surface. For example, a layer or level may be a three dimensional structure where two dimensions are greater than a third, e.g., a thin-film. Layers or levels may include different elements, components, and/or materials. In some examples, one layer or level may be composed of two or more sublayers or sublevels.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are signals), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:
    scanning, with an electron beam, a first set of word lines of a memory die having a first length and a second set of word lines of the memory die having a second length different than the first length;
    determining a first error rate associated with the first set of word lines based at least in part on scanning the first set of word lines;
    determining a second error rate associated with the second set of word lines based at least in part on scanning the second set of word lines; and
    categorizing a performance of the memory die based at least in part on the first error rate associated with the first set of word lines and the second error rate associated with the second set of word lines.

2. The method of claim 1, further comprising:
    determining a third error rate associated with a first type of error based at least in part on the first error rate of the first set of word lines and the second error rate of the second set of word lines; and
    determining a fourth error rate associated with a second type of error different than the first type of error based at least in part on the first error rate of the first set of word lines and the second error rate of the second set of word lines, wherein categorizing the performance is based at least in part on determining the third error rate and the fourth error rate.

3. The method of claim 2, wherein:
    the first type of error comprises one or more errors that occur because of shorting between word lines of the memory die; and the second type of error comprises one or more additional errors that occur because of shorting between word lines and vias of the memory die.

4. The method of claim 2, wherein determining the third error rate or determining the fourth error rate comprises:
determining a difference between the first error rate and the second error rate.

5. The method of claim 2, further comprising:
identifying a ratio of the first length of the first set of word lines and the second length of the second set of word lines, wherein determining the third error rate or determining the fourth error rate is based at least in part on the ratio of the first length and the second length.

6. The method of claim 2, further comprising:
determining whether the third error rate or the fourth error rate satisfies a threshold, wherein categorizing the performance of the memory die is based at least in part on determining whether the third error rate or the fourth error rate satisfies the threshold.

7. The method of claim 2, further comprising:
outputting an indication of the third error rate, the fourth error rate, the performance of the memory die, or a combination thereof.

8. A method, comprising:
coupling a first subset of access lines of a first set of access lines of a memory die have a first length with a substrate;
isolating a second subset of access lines of the first set from the substrate, the second subset different than the first subset;
applying an electron beam to the first set of access lines based at least in part on coupling the first subset with the substrate and isolating the second subset from the substrate;
scanning, with the electron beam, a second set of access lines of the memory die having a second length different from the first length;
determining a first error rate associated with the first set of access lines based at least in part on scanning the first set of access lines;
determining a second error rate associated with the second set of access lines based at least in part on scanning the second set of access lines; and
categorizing a performance of the memory die based at least in part on the first error rate associated with the first set of access lines and the second error rate associated with the second set of access lines.

9. The method of claim 8, further comprising:
identifying a first quantity of access lines based at least in part on the applying the electron beam, wherein determining the first error rate is based at least in part on identifying the first quantity of access lines.

10. The method of claim 1, wherein:
a first memory tile of the memory die comprises the first set of word lines; and
a second memory tile of the memory die different than the first memory tile comprises the second set of word lines.

11. The method of claim 1, wherein a type of error of the memory die comprises an access line to access line short, an access line to via short, or a combination thereof.

12. A method, comprising:
etching word lines of a plurality of memory tiles of a memory die to a first length, the plurality of memory tiles comprising a first memory tile;
etching word lines of a second memory tile to a second length shorter than the first length, wherein etching the word lines of the second memory tile comprises isolating one or more portions of each of the word lines from vias of the second memory tile, wherein a remaining portion of the word lines having the second length is coupled with the vias;
scanning, with an electron beam, the word lines of the first memory tile having the first length and the word lines of the second memory tile having the second length; and
determining a performance of the memory die based at least in part on the scanning the first memory tile and the second memory tile.

13. The method of claim 12, further comprising:
identifying the second length for word lines, wherein etching the second memory tile is based at least in part on identifying the second length.

14. The method of claim 12, wherein:
etching the word lines of the second memory tile to the second length occurs during at least a portion of a same processing step as etching the word lines of the plurality of memory tiles to the first length.

15. A method, further comprising:
etching word lines of a plurality of memory tiles of a memory die to a first length, the plurality of memory tiles comprising a first memory tile;
etching word lines of a second memory tile to a second length shorter than the first length;
scanning with an electron beam, the word lines of the first memory tile having the first length and the word lines of the second memory tile having the second length, wherein scanning the word lines of the first memory tile and the word lines of the second memory tile occurs during manufacturing processes of the memory die; and
determining performance of the memory die based at least in part on the scanning the first memory tile and the second memory tile.

16. An apparatus, comprising:
a first portion of a memory die comprising a first set of word lines having a first length; and
a second portion of the memory die comprising a second set of word lines having a second length different than the first length, wherein the second portion of the memory die is operable to determine a first error rate associated with the first set of word lines and a first type of error and a second error rate associated with the second set of word lines and a second type of error different than the first type of error.

17. The apparatus of claim 16, wherein the second length is shorter than the first length.

18. The apparatus of claim 17, wherein the first set of word lines and the second set of word lines are selectively couplable with a substrate using one or more vias.

19. The apparatus of claim 16, wherein:
the first type of error comprises one or more errors that occur because of shorting between adjacent word lines of the memory die; and
the second type of error comprises one or more additional errors that occur because of shorting between word lines and adjacent vias of the memory die.

* * * * *